United States Patent
Takeuchi et al.

(10) Patent No.: US 8,110,271 B2
(45) Date of Patent: Feb. 7, 2012

(54) ADHESIVE SHEET AND RELEASE SHEET

(75) Inventors: Osamu Takeuchi, Hyogo (JP); Takuo Nishida, Saitama (JP); Tomomi Fukaya, Chiba (JP)

(73) Assignee: Lintec Corporation, Tokyo (JP)

( * ) Notice: Subject to any disclaimer, the term of this patent is extended or adjusted under 35 U.S.C. 154(b) by 661 days.

(21) Appl. No.: 11/687,792

(22) Filed: Mar. 19, 2007

(65) Prior Publication Data

US 2007/0224378 A1    Sep. 27, 2007

(30) Foreign Application Priority Data

Mar. 23, 2006 (JP) ................................. 2006-080333

(51) Int. Cl.
*B32B 9/00* (2006.01)

(52) U.S. Cl. ....................... 428/41.8; 428/40.1; 156/709

(58) Field of Classification Search ................. 428/40.1, 428/40.2, 41.8, 41.7, 42.2, 42.3, 143, 144, 428/145, 147, 149, 168, 206, 311.31, 317.1, 428/317.3, 317.5, 343; 156/77, 78, 79, 344, 156/709, 711, 712, 719; 257/782, 783
See application file for complete search history.

(56) References Cited

U.S. PATENT DOCUMENTS

| | | | | |
|---|---|---|---|---|
| 6,594,114 B1 * | 7/2003 | Suzuki et al. | ............... | 360/244.3 |
| 7,153,629 B2 | 12/2006 | Sasaki et al. | | |
| 2003/0203193 A1 * | 10/2003 | Murata et al. | ............... | 428/343 |
| 2004/0003883 A1 * | 1/2004 | Kiuchi et al. | ................... | 156/77 |
| 2004/0037990 A1 * | 2/2004 | Abe et al. | .................... | 428/40.1 |
| 2004/0071919 A1 * | 4/2004 | Sakurai et al. | ............... | 428/41.8 |
| 2005/0136251 A1 | 6/2005 | Kishimoto et al. | | |
| 2005/0158568 A1 * | 7/2005 | Sasaki et al. | .................. | 428/500 |
| 2005/0261438 A1 * | 11/2005 | Beppu et al. | ............... | 525/330.3 |

FOREIGN PATENT DOCUMENTS

| | | |
|---|---|---|
| CN | 1637104 | 7/2005 |
| JP | 11-43650 | 2/1999 |
| JP | 2000-290610 | 10/2000 |
| JP | 2003-27038 | 1/2003 |
| JP | 2004-182836 | 7/2004 |
| JP | 2004-255699 | 9/2004 |
| JP | 2005-146080 | 6/2005 |
| JP | 2005-199586 | 7/2005 |
| JP | 2005-205813 | 8/2005 |

OTHER PUBLICATIONS

China Office action that issued with respect to patent family member Chinese Patent Application No. 200710089428.8, dated Jul. 26, 2011 along with an english translation thereof.
Japan Office action that issued with respect to patent family member Japanese Patent Application No. 2006-080333, mail date is May 10, 2011.
English language Abstract of JP 2005-205813, May 25, 2007.
English language Abstract of JP 2004-182836, Mar. 12, 2007.
Japan Office action that issued with respect to patent family member Japanese Patent Application No. 2006-080333, mail date is Oct. 4, 2011.

* cited by examiner

*Primary Examiner* — Alicia Chevalier
*Assistant Examiner* — Walter Moore
(74) *Attorney, Agent, or Firm* — Greenblum & Bernstein, P.L.C.

(57) ABSTRACT

There is provided an adhesive sheet comprising an adhesive base sheet, an adhesive layer, and a release sheet laminated in sequence from the adhesive base sheet. The release sheet comprises a release agent layer and a release base material laminated in sequence from the adhesive layer. A release force between the release sheet and the adhesive layer is decreased by an external stimulus.

16 Claims, 3 Drawing Sheets

ADHESIVE SHEET AND RELEASE SHEET

BACKGROUND OF THE INVENTION

1. Field of the Invention

The present invention relates to an adhesive sheet and a release sheet, particularly to an adhesive sheet and a release sheet for an electronic material, which are used in a process for producing a precision electronic device such as a ceramic capacitor, hard disk drive, or semiconductor device.

2. Description of the Related Art

Conventionally, it is known that an adhesive sheet is constituted of an adhesive base sheet, an adhesive layer, and a release sheet laminated together. In particular, the adhesive sheet is widely used with electronic materials, for example, in the production process for a precision electronic device such as a ceramic capacitor, hard disk drive, or semiconductor device.

The adhesive sheet for the electronic material is often bonded to a circuit surface of a wafer in a process for grinding the wafer in order to protect the circuit surface of the wafer from contamination. At this point, the release sheet is peeled away and then the adhesive sheet is bonded to the wafer while the adhesive sheet is being delivered from one roll to another; hence the adhesive sheet stretches when it is bonded to the wafer. The stretching adhesive sheet shrinks following bonding to the wafer, causing the wafer to warp, particularly when the stretching of the adhesive sheet is acute. In addition, the recent development of thinner wafers may be exacerbating the warping problem. Therefore, it is necessary to bond the adhesive sheet with a limited amount of stretching to the wafer.

The high release force of the release sheet makes the adhesive sheet stretch substantially when the release sheet is peeled away, and hence may cause the wafer to warp. Therefore, it is necessary to utilize a low release force in order to reduce the warp of the wafer.

The adhesive sheet is wound up into a roll-like shape and kept in storage before use. If the release force is low, however, a part of the release sheet may be released by itself from the adhesive sheet (namely "tunneling" occurs) while the rolled-up adhesive sheet is kept in storage.

A non-silicone release agent is utilized in the adhesive sheet used in a process for producing a precision electronic device conventionally. The non-silicone release agent prevents the silicone deposits from contaminating the electronic components, thus reducing the potential of defect in the electronic device.

The general non-silicone release agent does not release in a stable manner with respect to time when the release force is low; hence, the release force thereof should generally be made to be high. However, when 1,4-polybutadiene is utilized as the release agent, the release sheet maintains a low release force that releases in a stable manner with respect to with time, as shown in Japanese Unexamined Patent Publication (KOKAI) NO. 2005-205813 (hereinafter "Document 1").

In addition, as shown in Japanese Unexamined Patent Publication (KOKAI) NO. 2004-182836 (hereinafter "Document 2"), it is known that the releasing sheet having a releasing agent layer containing a gas generating agent in response to a stimulus is used in a process for producing a precision electronic device. In this release sheet, it is possible to decrease the release force by generating a gas in response to the stimulus.

However, even when 1,4-polybutadiene is utilized as the release agent, as shown in Document 1, the release force is still not low enough to reduce the warp of the wafer. Further, even if the release force is reduced by utilizing the silicone release agent in order to reduce the warp of the wafer, it is impossible to maximize the release force under storage conditions, thus making "tunneling" unavoidable. Furthermore, Document 2 discloses that the release force is variable by providing stimulus, but it does not disclose the presence of an expandable fine particle or a gas generating fine particle within the release sheet.

SUMMARY OF THE INVENTION

Therefore, an object of the present invention is to provide an adhesive sheet which can not only reduce the warp of an adherend such as a wafer, but also reduce the "tunneling" effect in storage conditions.

According to the present invention, there is provided an adhesive sheet comprising an adhesive base sheet, an adhesive layer, and a release sheet laminated in sequence from the adhesive base sheet. The release sheet comprises a release agent layer and a release base material laminated in sequence from the adhesive layer. The release agent layer decreases a release force between the release sheet and the adhesive layer in response to an external stimulus.

According to another aspect of this invention, there is provided a method for bonding the adhesive sheet to an adherend. In this method, the adhesive sheet that has been wound up into a roll-like shape is first prepared, then fed into a form of a sheet, which is then exposed to the external stimulus so that the release force is decreased. Following the reduction of the release force, the release sheet is peeled away from the adhesive sheet to expose the adhesive layer, which is bonded to the adherend.

BRIEF DESCRIPTION OF THE DRAWINGS

The objects and advantages of the present invention will be better understood from the following description, with reference to the accompanying drawings in which.

DESCRIPTION OF THE PREFERRED EMBODIMENTS

Figure 1:
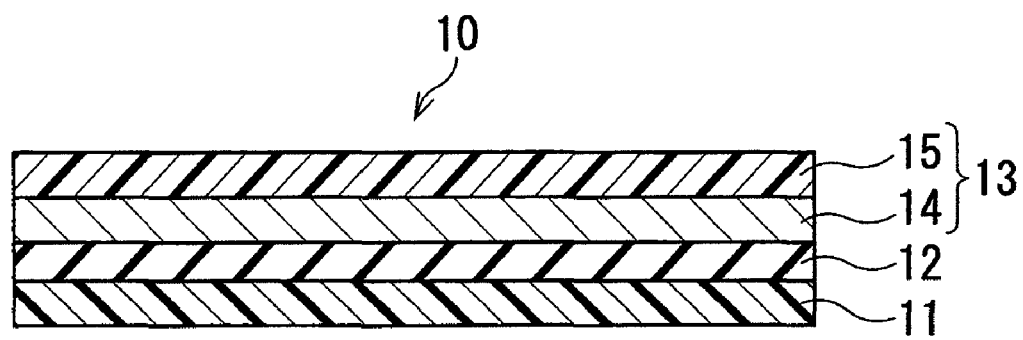
FIG. 1 is a sectional view of an adhesive sheet in a first embodiment of the present invention.

The present invention will be described below with reference to the embodiments shown in the drawings.

Figure 2:
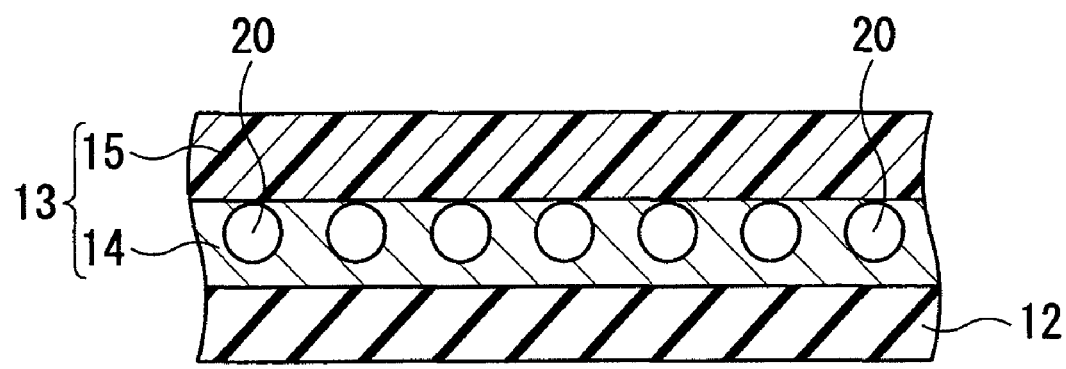
FIG. 2 is a sectional view of a release sheet in the first embodiment.

FIG. 1 is a sectional view of an adhesive sheet in the first embodiment of the present invention. FIG. 2 is a sectional view of a release sheet. As shown in FIG. 1, an adhesive sheet 10 comprises an adhesive base sheet 11, an adhesive layer 12, and a release sheet 13 laminated in sequence from the adhesive base sheet 11. The release sheet 13 comprises a release agent layer 14 adhering to the adhesive layer 12, and a release base material 15 supporting the release agent material, laminated in sequence from the adhesive layer 12.

As shown in FIG. 2, the release agent layer 14 contains a release agent and a plurality of an expandable fine particle or a gas generating fine particle 20 that is intermixed in the release agent. As for the release agent, a non-silicone release agent, for example a rubber resin such as 1,4-polybutadiene, a long chain alkyl resin such as a polymer of alkylacrylate, an alkyd resin, or the like can be utilized. Due to this, the release agent layer 14 can consist of the non-silicone compound. As for the 1,4-polybutadiene, polybutadiene composed of only 1,4-bond, except for 1,2-bond that is inevitably generated in polymerization, can be utilized. The 1,4-polybutadiene can be cis configuration, trans configuration, or a combination of both, with an optional level of cis content in the mixture. The polymer of alkylacrylate can include a polymer or a copolymer of alkylacrylate with 8 carbon atoms or more, preferably 10 carbon atoms or more, such as a copolymer of stearylacrylate and 2-(perfluorooctyl)ethylacrylate. A halogen atom such as a fluorine atom may be substituted for the hydrogen atom in the alkylacrylate. Further, one or more additives can be added to the release agent as the need arises.

The expandable fine particle 20 comprises a shell composed of thermoplastic resin and an expandable material encapsulated therein. The expandable material expands in response to external stimulus such as heat and an activation energy beam, thus the thermally expandable material or activation energy beam expandable material can be utilized as for the expandable material. The thermally expandable material that expands in response to heat includes a physical gas generating agent, for example a hydrocarbon having a low boiling point, such as butane, pentane, and hexane; an inorganic gas generating agent such as sodium bicarbonate, ammonium carbonate, and ammonium bicarbonate; an organic gas generating agent such as an azonitrile compound, for example 2,2'-azobis(4-methoxy-2,4-dimethyl valeronitrile), 2,2'-azobis(2,4-dimethyl valeronitrile), 2,2'-azobis(2-methyl propionyl), 2,2'-azobis(2-methyl butyronitrile), 1,1'-azobis(cyclohexanone-1-carbonitrile), 1-[(1-cyano-1-methyl ethyl)azo]formamide, 2-phenylazo-4-methoxy-2,4-dimethyl valeronitrile; an azoamidine compound, for example 2,2'-azobis(2-methyl-N-phenyl propionamidine)dihydrochloride, 2,2'-azobis[N-(4-chlorophenyl)-2-methyl propionamidine], 2,2'-azobis[N-(4-hydroxyphenyl)-2-methyl propionamidine]dihydrochloride, 2,2'-azobis[2-methyl N-(phenylmethyl)-propionamidine]dihydrochloride, 2,2'-azobis[2-methyl N-(2-propenyl)propionamidine]dihydrochloride, 2,2'-azobis(2-methyl propionamidine)dihydrochloride, 2,2'-azobis[N-(2-hydroxyethyl)-2-methyl propionamidine]; a cycloazoamidine compound, for example 2,2'-azobis[2-(5-methyl-2-imidazoline-2-yl)propane]dihydrochloride, 2,2'-azobis[2-(2-imidazoline-2-yl)propane]dihydrochloride, 2,2'-azobis[2-(4,5,6,7-tetrahydro-1H-1,3-diazepine-2-yl)propane]hydrochloride, 2,2'-azobis[2-(3,4,5,6-tetrahydropyrimidine-2-yl)propane]dihydrochloride, 2,2'-azobis[2-(5-hydroxy-3,4,5,6-tetrahydropyrimidine-2-yl)propane]dihydrochloride, 2,2'-azobis{2-[1-(2-hydroxyethyl)-2-imidazoline-2-yl]propane}dihydrochloride, 2,2'-azobis[2-(2-imidazoline-2-yl)propane]; an azoamide compound, for example 2,2'-azobis{2-methyl-N-[1,1-bis(hydroxymethyl)-2-hydroxyethyl]propionamide}, 2,2'-azobis{2-methyl-N-[1,1-bis(hydroxymethyl)ethyl]propionamide}, 2,2'-azobis[2-methyl-N-(2-hydroxyethyl)-propionamide], 2,2'-azobis(2-methyl propionamide)dehydrate; an alkylazo compound, for example 2,2'-azobis(2,4,4-trimethyl pentene), 2,2'-azobis(2-methyl propane); and one other compound, for example dimethyl-2,2'-azobis(2-methyl propionate), 4,4'-azobis(4-cyamevaleric acid), 2,2'-azobis[2-(hydroxymethyl)propione nitrile, dinitroso pentamethylene tetramine, azodicarbonamide, p-toluenesulfonyl hydrazide, p-toluenesulfonyl acetone hydrazone, 4,4'-oxybis(benzenesulfonyl hydrazide); and the like, which may be utilized either singularly or in a mixture. The thermally expandable material is vaporized or decomposed into gas by heating the thermally expandable particle at a predetermined temperature, namely a kick-off temperature, or greater, so that the shell is expanded outward.

The activation energy beam expandable material that expands in response to the activation energy beam includes a photodecomposition compound which is decomposed into gas by irradiation of the activation energy beam, such as ultraviolet ray, electron ray, and others. As for the photodecomposition compound, a compound with an azido or diazo group can be utilized. The compound with the azido group includes p-azido benzaldehyde, p-azido acetophenone, p-azido benzoic acid, p-azido benzaldehyde-2-sulfonic acid sodium, p-azido benzal acetophenone, 4,4-diazido chalcone, 2,6-bis(4'-azido benzal)cyclohexanone, 2,6-bis(4'-azido benzal)4-methylcyclohexanone, 1,3-bis(4'-azido benzal)-2-propanone, p-azido benzalacetone, p-azido benzalacetone-2-sulfonic acid sodium, 1,3-bis(4'-azido cinnamylidene)-2-propanone, 1,3-bis(4'-azido benzal)-2-propanone 2'-sulfonic acid, 4,4'-diazido stilbene-2,2'-disulfonic acid, 4,4'-diazido stilbene2,2'-disulfonic acid sodium, 1,3-bis(4'-azido benzal)-2-propanone2,2'-disulfonic acid, 1,3-bis(4'-azido benzal)-2-propanone 2,2'-disulfonic acid sodium, 2,6-bis(4'-azido benzal)cyclohexanone 2,2'-disulfonic acid, 2,6-bis(4'-azido benzal)cyclohexanone 2,2-disulfonic acid sodium, 2,6-bis(4'-azido benzal)methylcyclohexanone2,2-disulfonic acid, 2,6-bis(4'-azido benzal)methylcyclohexanone2,2-disulfonic acid sodium, 1-azido pyrene, 3-sulfonyl azido benzoic acid, 4-sulfonyl azido benzoic acid, 2,6-dichloro-4-nitro azido benzene, azido diphenylamine, and the like. The compound with the diazo group includes p-diazo diphenylamine, 1,2-naphthoquinone-2-diazido 5-sulfonic acid isobutyl ester, 2,3,4-trioxybenzophenone3,4-bis(naphthoquinone-1,2-diazido 5-sulfonic acid)ester, 2-(naphthoquinone-1,2-diazido-5-sulfonyloxy)7-oxynaphthalene, naphthoquinone1,2-diazido 5-sulfanilide, naphthoquinone-1,2-diazido 5-sulfonic acid novolak ester, and the like. The above compound may be utilized either singularly or in mixture. The activation energy beam expandable material generates gas by irradiation by the activation energy beam at a predetermined intensity, thus causing the shell of the activation energy beam expandable fine particle to expand outward.

The gas generating fine particle 20 may have a shell composed of thermoplastic resin, and another material encapsulated therein. The shell of the gas generating fine particle 20 may be broken in response to heating the gas generating fine particle 20 at the predetermined temperature so that the vaporized or decomposed material in the shell is released as the gas. In addition, the shell may be broken in response to other stimuli, such as irradiation of the gas generating fine particle 20 by the activation energy beam at the predetermined intensity, so that the vaporized or decomposed material in the shell is released as the gas. In these cases, as the material encapsulated in the shell, a thermally expandable or activation energy beam expandable material, as described above, can be utilized. Further, the case where the expandable fine particle 20 is used is explained below, but the case where the gas generating fine particle 20 is used may be similar.

The release agent layer 14 is prepared with heat by drying a release agent liquid applied as a coating to the release base material 15. The release agent liquid is prepared by dissolving or dispersing the release agent and the plurality of the expandable fine particle 20 into an organic solvent such as toluene and methylethylketone (MEK). One or more additives, including an antioxidant, can be added to the release agent liquid in addition to the release agent and the expandable fine particles. Example methods for applying the release agent to the release base material 15 include conventional methods such as bar coating, reverse-roll coating, knife coating, roll knife coating, gravure coating, air doctor coating, doctor blade, and the like.

When the thermally expandable fine particle is used as the expandable fine particle 20, the heat temperature used in the drying process described above is less than the kick-off temperature of the thermally expandable fine particle. When the release agent in the release agent layer 14 includes a heat polymerization or heat crosslinking type, the release agent can be polymerized or crosslinked in the drying process described above. In this case, the heat temperature in the drying process is greater than or equal to the polymerization or crosslinking starting temperature, but less than the kick-off temperature of thermally expanding. When the release agent in the release agent layer 14 includes a photopolymerization or photocrosslinking type, the release agent can be polymerized or crosslinked by irradiation of an activation energy beam such as an ultraviolet ray after the process for drying by heating.

The average thickness (the average coated layer thickness after drying) of the release agent layer 14 is 0.1 to 20 μm, and is preferably 1 to 15 μm. The average diameter of the expandable fine particle 20 is not more than three times the average thickness of the release agent layer 14, and is preferably 0.5 to 2 times the average thickness. If the average diameter is more than three times the average thickness, it is difficult to bond the expandable fine particle 20 to the release agent layer 14. The average diameter of the expandable fine particle 20 can be more or less than the average thickness of the release agent layer 14. When the average diameter of the expandable fine particle 20 is not more than the average thickness of the release agent layer 14, the interface between the adhesive layer 12 and the release agent layer 14 is smooth, because the expandable fine particle 20 is embedded within the release agent layer 14.

The release agent layer 14 preferably includes 5 to 50 parts by weight of the expandable fine particle 20 with respect to 100 parts by weight of the release agent. If less than 5 parts by weight, the release force is not decreased sufficiently when the expandable fine particle 20 is expanded. If more than 50 parts by weight, it is difficult to polymerize or crosslink the release agent on the release base material 15 after coating.

The release base material 15 is not limited to one specific material, and can be selected from a number of different conventional materials; for example a polyester film such as a polyethyleneterephthalate, a polybutyleneterephthalate, and a polyethylenenaphthalate, a polyethylene film, a polypropylene film, a poly(vinyl chloride) film, a poly(vinylidene chloride) film, a poly(vinyl alcohol) film, an ethylene vinyl acetate copolymer film, a polystyrene film, a polycarbonate film, a polymethylpentene film, a polysulfone film, a poly(ether ether ketone) film, a poly(ether sulfone) film, a poly(phenylene sulfide) film, a polyether imide film, a polyimide film, a fluororesin film, a polyamide film, an acrylic resin film, a norbornene resin film, a cycloolefin resin film, and the like.

The adhesive base sheet 11 is not limited to one specific sheet, and for example a plastic film such as a poly(vinyl chloride) sheet, polyolefin sheet, and the like can be utilized as the adhesive base sheet 11.

Conventional adhesive can be utilized as the adhesive in the adhesive layer 12. It is preferable to utilize a non-silicone adhesive such as a rubber, acryl, polyester, and urethane, particularly when the adhesive sheet is used for electronic material. Due to this, the adhesive layer 12 can consist of the non-silicone compound. The adhesive is coated onto the release agent layer 14, which has formed on the release base material 15, and the coated adhesive is then dried by heating, to prepare the adhesive layer 12. The adhesive base sheet 11 is laminated onto the adhesive layer 12 to prepare the adhesive sheet 10.

The expandable fine particles 20 in the release agent layer 14 is expanded by the external stimulus, thus increasing area of contact between the expandable fine particles 20 and the adhesive layer 12, while decreasing the area of contact between the release agent and the adhesive layer 12. The decrease of the area of contact between the release agent and the adhesive layer 12 causes a decrease in the release force between the release sheet 13 and the adhesive layer 12. Namely, the decrease of the release force by the external stimulus allows the release sheet 13 to release from the adhesive layer 12 by a relatively smaller peeling force. Similarly, if the expandable fine particles 20 release the gas by the external stimulus, the area of contact between the release agent and the adhesive layer 12 is decreased, causing the release force to decrease.

Figure 3:
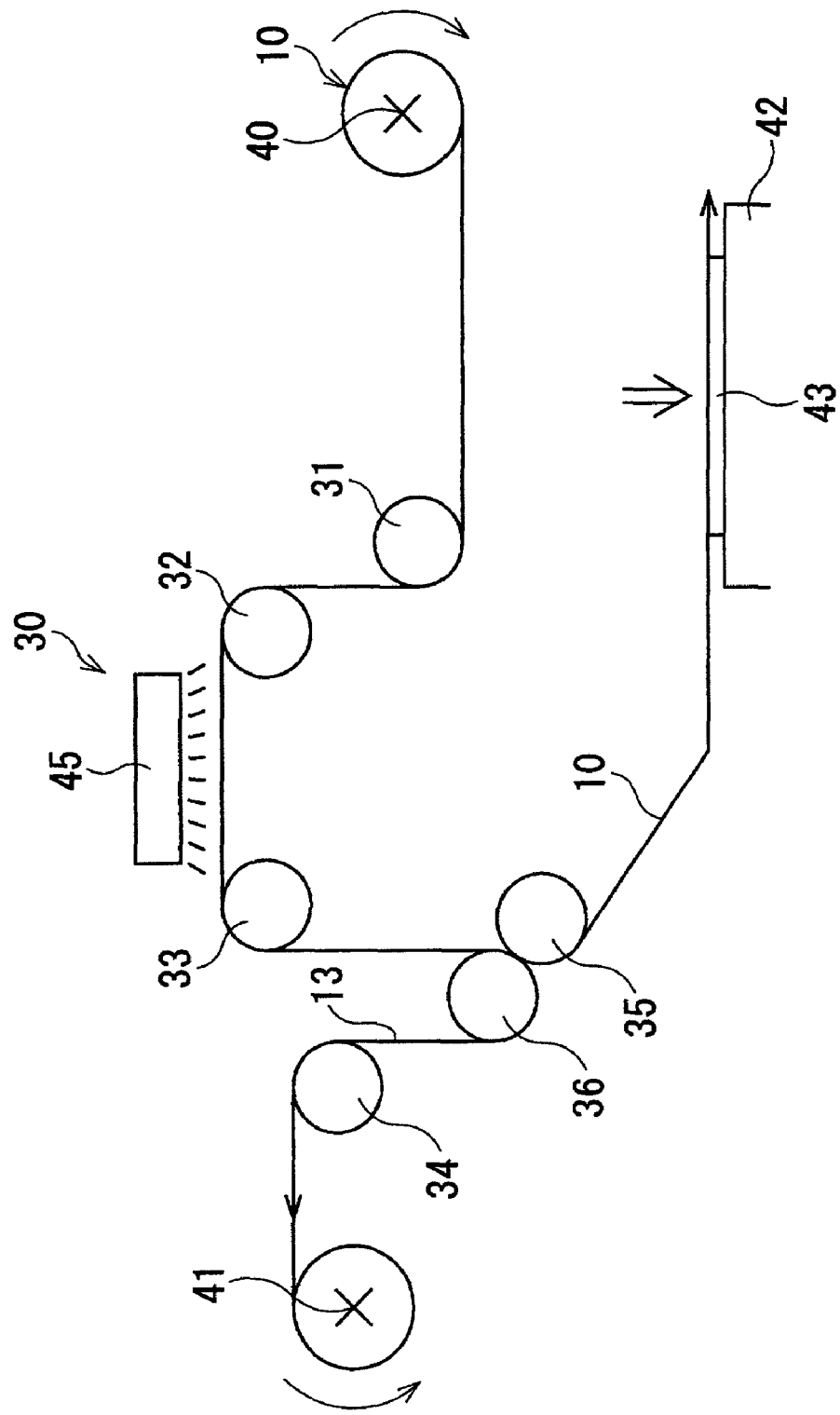
FIG. 3 is a view of a laminating apparatus for explaining one embodiment of use of the adhesive sheet.

FIG. 3 is a schematic view of a laminating apparatus for indicating one embodiment of use of the adhesive sheet 10. In this embodiment, the adhesive sheet 10 is bonded onto an electronic material (adherend), such as the wafer 43, by a laminating apparatus 30, namely the adhesive sheet 10 is used for the electronic material. Further, per the explanation below, the release agent layer 14 includes thermally expandable fine particles 20 which expand in response to heat.

In this embodiment, the adhesive sheet 10 is wound into the roll-like shape so that the release sheet 13 is arranged on the inner side of the adhesive sheet 10 in the roll-like shape.

In the laminating apparatus 30, the roll-like shaped adhesive sheet 10 is mounted around a feed roll 40. The adhesive sheet 10, which is fed out from the feed roll 40 into a form of a sheet, is delivered to between first and second releasing rolls 35 and 36 via 1st-3rd conveyor rolls 31, 32, and 33. As the adhesive sheet 10 passes from the second conveyor roller 32 to the third conveyor roller 33, the adhesive sheet 10 is exposed to the external stimulus, namely heated by a heating device 45 at a temperature that is equal to or greater than the kick-off temperature. Due to this heating, the expandable fine particle 20 in the adhesive sheet 10 is expanded, effectively decreasing the release force between the release sheet 13 and the adhesive layer 12.

Following the delivery of the adhesive sheet 10 between the first and second releasing rolls 35 and 36, the release sheet 13 of the adhesive sheet 10 is twined around the first releasing roll 35 and the adhesive base sheet 11 is twined around the second releasing roll 36, so that the release sheet 13 is peeled away from the adhesive sheet 10 and the adhesive layer 12 is exposed.

The release sheet 13 peeled away from the adhesive sheet 10 is delivered from the second releasing roll 36 to a first wind-up roll 41 via a fourth conveyor roll 34, and then wound around the first wind-up roll 41. The adhesive sheet 10, from which the release sheet 13 was released, is pulled by a pulling apparatus such as a pull roll (not shown in FIG. 3) to be delivered above a table 42, upon which the wafer (adherend) 43 is disposed. The adhesive sheet 10 delivered above a table 42 is positioned directly over the wafer 43 so that the exposing adhesive layer 12 faces to the upper surface of the wafer 43.

Once a predetermined length of the adhesive sheet 10 covers the length of the wafer 43, the adhesive sheet 10 stops being delivered. Following delivery, the adhesive sheet 10 is pushed downward by a pressing apparatus, such as a pressure roll (not show in FIG. 3) which is located above the table 42, so that the exposed adhesive layer 12 comes into contact with the upper surface of the wafer 43, thus bonding the predetermined length of the adhesive sheet 10 onto the wafer 43.

Afterwards, delivery of the adhesive sheet 10 resumes in order to repeat the bonding of the adhesive sheet 10 to each wafer 43. Following bonding of the predetermined length of adhesive sheet 10, the adhesive sheet 10 can be cut to the predetermined length, or along the periphery of the wafer 43.

As described above, in this embodiment the release force of the release sheet 13 decreases after the roll-like shaped adhesive sheet 10 is fed out in a form of a sheet, which can maintain a high release force in the roll-like shaped adhesive. Therefore, while the adhesive sheet 10 is kept in storage, the release sheet 13 does not release itself from the adhesive layer 12; namely, "tunneling" does not occur.

On the other hand, the release sheet 13 can be peeled away from the adhesive sheet after the release force is reduced by the effect of heating. Therefore, the release sheet 13 can be peeled away by a relative small force, thus preventing excessive stretching of the adhesive sheet 10 when peeling away the release sheet.

As described above, the adhesive sheet 10 is not stretched excessively during the process of peeling away the release sheet; therefore, the minimally stretched adhesive sheet 10 that is bonded to the wafer 43 experiences limited shrinkage after bonding. Accordingly, excessive warp in the wafer 43 caused by shrinkage of the adhesive sheet 10 is also avoided. Further, the release sheet 13 is peeled away by a relatively small force, thus preventing the adhesive from remaining on the release sheet after it has been peeled away; namely, the failure to release is eliminated.

Further, because both the adhesive layer and release agent layer are formed by the non-silicone agent, a silicone compound does not adhere to the surface of the wafer 43 and cause an impurity.

Furthermore, the thermally expandable fine particle that responds to heat is used as the expandable fine particle 20 in this embodiment. However, a different expandable fine particle that responds to other external stimulus, for example an activation energy beam can be utilized in this embodiment. In this case, an apparatus providing for other external stimulus, for example an apparatus of an irradiating activation energy beam instead of the heating device 45 is provided in the laminating apparatus 30. Further, the adhesive sheet 10 is used for electronic materials in this embodiment, but it can be used for other materials.

Figure 4:
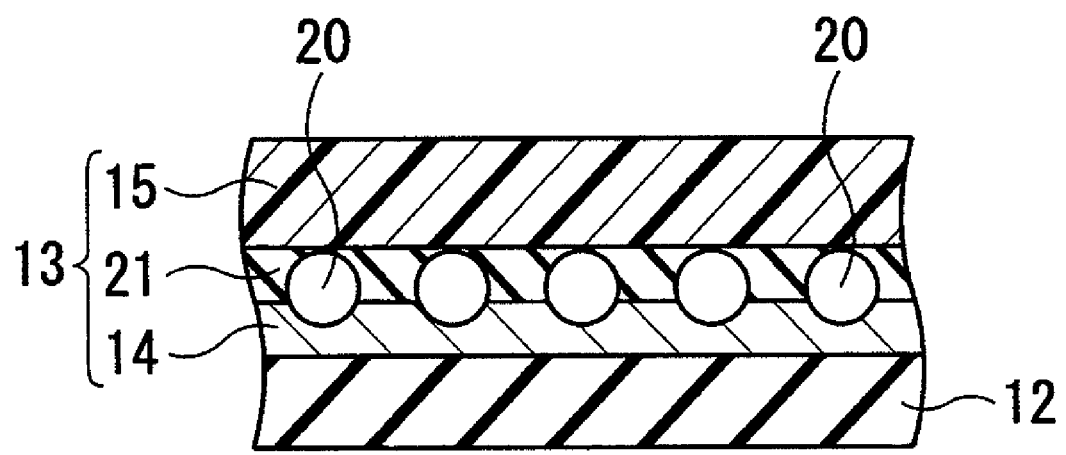
FIG. 4 is a sectional view of a release sheet in the second embodiment.

FIG. 4 is a sectional view of a release sheet in the second embodiment. As shown in FIG. 4, a primer layer 21 is laminated between the release agent layer 14 and the release base material 15 in this embodiment. As for the primer forming the primer layer 21, polyacrylate resin, polyurethane resin, epoxy resin, polyether resin, polycarbonate resin, rubber resin, and like can be utilized. Further, the resin which is mentioned above as the material for the release agent may be utilized as the primer. When the primer layer 21 has been applied to the adhesive sheet 10, the multilayer, which is constituted from the release agent layer 14 and the primer layer 21, contains and holds the expandable fine particle. Because of the primer layer 21, the adhesive properties between the release base material 15 and the release agent layer 14 can be improved.

In this embodiment, the primer layer 21 and the release agent layer 14 are prepared as described below. First, the primer liquid, which is prepared by dissolving or dispersing the primer and the expandable fine particle 20 into an organic solvent such as toluene or MEK, is applied as a coating to the release base material 15, and the coated primer liquid is then dried by heating to form the primer layer 21. Next, the release agent liquid not containing the expandable fine particle is applied as a coating to the primer layer 21, and the coated release agent liquid is dried by heating to form the release agent layer 14. Further, in this embodiment, depending on the primer or release agent that is used, the coated primer liquid or release agent liquid 14 may be irradiated by an activation energy beam in order to polymerize the primer or the release agent either before or after drying by heating. Further, one or more additives, including an antioxidant, can be added to the release agent liquid and the primer liquid.

Further, when the primer layer 21 is affixed to the adhesive sheet 10, the average total thicknesses of the primer layer 21 and the release agent layer 14 is 0.1 to 20 μm, and is preferably 1 to 15 μm. The average diameter of the expandable fine particles is not more than three times the average total thickness of the primer layer 21 and the release agent layer 14, and is preferably 0.5 to 2.0 times the average total thickness. The primer layer 21 preferably includes 0.5 to 50 parts by weight of the expandable fine particle with respect to 100 parts by weight of the primer.

In each embodiment described above, the release force is decreased by an external stimulus, so that the release sheet can be peeled away by a relatively small pulling force, following exposure to the external stimulus. Accordingly, the adhesive sheet bonded to the adherend is not stretched excessively, which prevents the shrinkage stress from acting on the adherend, hence reducing the warp in the adherend. Further, the release sheet is not released by itself, namely "tunneling" does not occur, while the adhesive sheet is kept in storage because the release force is relatively high before exposure to the external stimulus. Furthermore, the use of a non-silicone compound for the release agent layer and adhesive layer prevents silicone deposits from contaminating the electronic components.

Next, the present invention shall be explained in further detail with reference to examples, but the present invention shall be restricted by these examples.

Example 1

20 parts by weight of thermally expandable fine particles (brand name: thermally expandable microcapsule M330, manufactured by Dainichiseika Color & Chemicals Mfg. Co., Ltd) and 1 part by weight of a metal catalyst (brand name: SRX212, manufactured by Shin-Etsu Chemical Co., Ltd.) were added to 100 parts by weight of 1,4-polybutadiene (containing cis 1,4-bond of 95%; brand name: JSR-BR-10, manufactured by JSR Corp.) as a release agent, and the resultant mixture was diluted with toluene to prepare a release agent liquid with a solid concentration of 20% by weight. The thermally expandable fine particles had an average particle diameter of 11 μm, and a kick-off temperature of 104° C.

The release agent liquid was applied as a coating onto a release base material of a polyethyleneterephthalate film having a thickness of 38 μm, by a roll knife coater, and then was dried at 90° C. for 1 minute so that the thickness of a coated layer after drying was made to be 10 μm. Next, the coated layer was irradiated with ultraviolet ray by a belt conveyer type ultraviolet ray irradiation apparatus having a fusion H valve of one 240 W/cm lamp under the condition of the conveyer speed being 40 m/minute (ultraviolet ray irradiation amount of 22 mJ/cm$^2$), so that the coated layer was cured and a release sheet having the release agent layer was obtained.

Acryl resin adhesive (brand name: BPS5127, manufactured by Toyo Ink Mfg. Co., Ltd.) was applied as a coating, by a roll knife coater, onto a surface of the release sheet where the release agent layer was laminated, and the coated layer was dried at 90° C. for 2 minutes to form an adhesive layer, so that the thickness of a coated layer after drying was made to be 30 μm. Next, an adhesive base sheet of poly(vinylchloride) sheet having a thickness of 70 μm was laminated onto the adhesive layer to prepare an adhesive sheet. Further, in this Example, the release sheet was wound into a roll-like shape once, and the roll-like shaped release sheet was subsequently fed out into a form of a sheet and the adhesive was applied thereon.

Example 2

20 parts by weight of the same thermally expandable fine particles as those in Example 1, 1 part by weight of trimethylol propane (manufactured by Tokyo Chemical Industry Co., Ltd.) as a crosslinking agent, and 5.2 parts by weight of TMP adduct XDI (brand name: TD-75, manufactured by Soken Chemical & Engineering Co., Ltd.) as a crosslinking agent were added to 100 parts by weight of a copolymer of stearylacrylate and 2-(perfluorooctyl)ethylacrylate (compound weight ratio 90:10), and the resultant mixture was diluted with toluene to prepare a release agent liquid having a solid concentration of 20% by weight.

The release agent liquid was applied as a coating onto a release base material of a polyethyleneterephthalate film having a thickness of 38 μm, by a roll knife coater, and then the coated layer was dried at 90° C. for 1 minute, so that the thickness of the coated layer after drying was made to be 10 μm to obtain a release sheet having the release agent layer. An adhesive layer and an adhesive base sheet were laminated onto the release sheet, similar to Example 1, so that an adhesive sheet was obtained.

Example 3

20 parts by weight of the same thermally expandable fine particles as those in Examples 1 and 2, and 1 part by weight of a metal catalyst (brand name: SRX212, manufactured by Shin-Etsu Chemical Co., Ltd.) were added to 100 parts by weight of 1,4-polybutadiene (containing cis 1,4-bond of 95%; brand name: JSR-BR-10, manufactured by JSR Corp.) as a release agent, and the resultant mixture was diluted with toluene to prepare a primer liquid having a solid concentration of 20% by weight. Further, 1 part by weight of trimethylol propane (manufactured by Tokyo Chemical Industry Co., Ltd.) as a crosslinking agent, and 5.2 parts by weight of TMP adduct XDI (brand name: TD-75, manufactured by Soken Chemical & Engineering Co., Ltd.) as a crosslinking agent were added to 100 parts by weight of a copolymer of stearylacrylate and 2-(perfluorooctyl)ethylacrylate (compound weight ratio 90:10), and the resultant mixture was diluted with toluene to prepare a release agent liquid having a solid concentration of 1% by weight.

The primer liquid was applied as a coating onto a release base material of a polyethyleneterephthalate film having a thickness of 38 μm, by a roll knife coater, and the coat layer was dried at 90° C. for 1 minute, so that the thickness of the coated layer after drying was made to be 10 μm. Next, the coated layer was irradiated with ultraviolet ray in the same manner as that in Example 1, so that the coated layer was cured and a primer layer was formed on to the release base material. Next, the release agent liquid was applied as coating onto the primer layer by a Meyer bar, and the coated layer was dried at 90° C. for 1 minute, so that the thickness of the coated layer after drying was made to be 0.1 μm, so that the release agent layer was formed on to the primer layer and a release sheet was obtained. An adhesive layer and an adhesive base sheet were laminated on to the release sheet, similar to Example 1, so that an adhesive sheet was obtained.

Comparative Example 1

A release agent liquid containing the same compounds as those of Example 1 was prepared, except that thermally expandable fine particles were not added. The release agent liquid was applied as a coating onto a release base material of a polyethyleneterephthalate film having a thickness of 38 μm, by a Meyer bar, and the coated layer was dried at 90° C. for 1 minute, so that the thickness of the coated layer after drying was made to be 0.1 μm. Next, the coated layer was irradiated with ultraviolet ray, in the same manner as Example 1, so as to obtain a release sheet having a release layer laminated onto the release base material. An adhesive layer and an adhesive base sheet were laminated onto the release sheet, similar to Example 1, so that an adhesive sheet was obtained.

Comparative Example 2

1 part by weight of a metal catalyst (brand name: SRX212, manufactured by Dow Corning Toray silicone Co., Ltd.) was added to 100 parts by weight of a thermosetting silicone (brand name: SRX211, manufactured by Dow Corning Toray Silicone Co., Ltd.) whose main compound was polydimethylsiloxane containing a vinyl group as a functional group, and the resultant mixture was diluted with toluene to prepare a release agent liquid having a solid concentration of 1% by weight.

The release agent liquid was applied as a coating onto a release base material of a polyethyleneterephthalate film having a thickness of 38 μm, by a Meyer bar, and the coated layer was dried at 90° C. for 1 minute, so that the thickness of the coated layer after drying was made to be 0.1 μm so as to obtain a release sheet having the release layer laminated onto the release base material. An adhesive layer and an adhesive base sheet were laminated onto the release sheet, similar to Example 1, so that an adhesive sheet was obtained.

The adhesive sheets in Examples 1-3 and Comparative Examples 1-2 were evaluated according to the tests below.
(1) Release Force The release force was measured by using an adhesive sheet having a width of 20 mm and a length of 150 mm. In the measurement of the release force, first the adhesive sheet was left to stand for 2 hours at 23° C. under 50% humidity following production of the adhesive sheet. Next, the adhesive sheet was heated at 125° C. for 1 minute to expand the thermally expandable fine particles. Then, the release force between the release sheet and the adhesive layer was measured. In addition, after the adhesive sheet was left to stand for 2 hours at 23° C. under 50% humidity following production of the adhesive sheet, the release force between the release sheet and the adhesive layer was measured without heating (namely, before expanding the thermally expandable fine particles). The release force between the release sheet and the adhesive layer was measured by peeling the release sheet away from the adhesive sheet at a pealing angle of 180° and a peeling rate of 0.3 mm/min, in the state where the adhesive base sheet was fixed. Further, the release force was evaluated by using an average of three measured values with regard to each adhesive sheet.
(2) Tunneling Test An adhesive sheet having a width of 320 mm and a length of 200 m was wound around a core having a diameter of 76 mm to prepare a roll-like shaped adhesive sheet. After winding, the roll-like shaped adhesive sheet was left to stand for 1 week at 25° C. under 50% humidity, at which point it was confirmed whether the adhesive layer was lifted from the release sheet. When there was "lifting" in the adhesive sheet, "x" was filled in Table 1, and when there was no "lifting" in the adhesive sheet, "○" was filled in Table 1.

(3) Evaluation of Wafer's Warp

Evaluation of Wafer's Warp was conducted using a laminating apparatus (brand name: RAD-3500 F/12, manufactured by Lintec Corp.). First, the roll-like shaped adhesive sheet was prepared in the same manner as that in Tunneling Test. Next, the prepared sheet was fed out into a form of a sheet and then heated at 125° C. for 1 minute to expand the thermally expandable fine particle. Next, the release sheet was peeled away from the adhesive sheet, and the adhesive sheet was then bonded to a test wafer. A dummy wafer, namely a disk shaped polyethyleneterephthalate film having a diameter of 20.3 mm and a thickness of 100 μm was utilized as the test wafer. Further, the adhesive sheet bonded to the test wafer was cut along the periphery of the test wafer, so that the cut adhesive sheet covered the entire surface of the test wafer. The evaluation of wafer's warp was conducted by measuring the difference between the height at the center and the height along the periphery of the wafer to quantify the amount of warp in the test wafer. When there was a difference greater or equal than 10 mm, "x" was filled in Table 1, otherwise "o" was filled in Table 1.

(4) Evaluation of Silicone Content

The silicone content on the surface of the release sheet where the release agent layer was laminated was measured by X-ray photoelectron spectroscopy (XPS). As the measuring device, ESCA 5600 (brand name, manufactured by PerkinElmer, Inc.) was utilized, and the X-ray source was Mg standard (15 kv, 400 W). Further, the take-off angle was 45°, the measuring time was 3 minutes, and the measured atoms were silicon (Si) and carbon (C). The silicone content which was calculated by multiplying the value of Si/(Si+C) by 100 was indicated as "%" in Table 1.

TABLE 1

| | Release Force mN/20 mm | | | | |
|---|---|---|---|---|---|
| | Before Heating | After Heating | Tunneling | Wafer's Warp | Silicone Contents |
| Ex. 1 | 292 | 153 | o | o | 0.0% |
| Ex. 2 | 254 | 127 | o | o | 0.0% |
| Ex. 3 | 250 | 180 | o | o | 0.0% |
| Comp. Ex. 1 | 300 | 300 | o | x | 0.0% |
| Comp. Ex. 2 | 50 | 50 | x | o | 24.7% |

As described above, there was no "tunneling" in the adhesive sheets wound into roll-like shapes in Examples 1-3 because the release force before heating was not less than 250 mN/20 mm, and high enough to avoid tunneling. In addition warp was not apparent in the wafer to which the adhesive sheet in Examples 1-3 was bonded after heating, because the release force after heating was not more than 200 mN/20 mm, and low enough to avoid warp. In contrast, the release force in Comparative Examples 1-2 did not change before heating and after heating because the adhesive sheet did not have the expandable fine particle. In Comparative Example 1, the invariably high release force of 300 mN/20 mm did not lead to "tunneling", but did cause a high amount of warp in the wafer. In Comparative Example 2, the invariably low release force of 50 mN/20 mm did not cause the wafer to warp, but did produce a "tunneling" effect in the roll-like shaped adhesive sheet.

Further, because a non-silicone compound was utilized as the release agent, silicone contamination was not detected in Examples 1-3. On the other hand, because the silicone compound was utilized as the release agent in Comparative Example 2, a substantial amount of silicone contamination was detected.

As described above, the release agent layer with the thermally expandable fine particle prevented the "tunneling" in the roll-like shaped adhesive sheet and the warp in the wafer to which the adhesive sheet was bonded in each Example. Further, no silicone contamination was detected in each Example because a non-silicone compound was utilized as the adhesive and release agents.

Although the embodiments of the present invention have been described herein with reference to the accompanying drawings, obviously many modifications and changes can be made by those skilled in this art without departing from the scope of the invention.

The present disclosure relates to subject matter contained in Japanese Patent Application No. 2006-080333 (filed on Mar. 23, 2006) which is expressly incorporated herein, by reference, in their entirety.

The invention claimed is:

1. An adhesive sheet comprising:
    an adhesive base sheet, an adhesive layer, and a release sheet laminated provided in this order from said adhesive base sheet, wherein
    said release sheet comprises a release base material, a primer layer, and a release agent layer provided in this order and said release agent layer faces the adhesive layer of the adhesive sheet;
    in response to an external stimulus, a release force between said release sheet and said adhesive layer is decreased;
    the primer layer and the release agent layer of the release sheet form a multilayer and the primer layer comprises of an expandable fine particle that expands in response to the external stimulus; and
    the release agent layer, the primer layer, and the release base material are structured and arranged to be released together from the adhesive layer when the release sheet is peeled after receiving the external stimulus.

2. A sheet according to claim 1, wherein said expandable fine particle comprises a shell and an expandable material encapsulated therein, said expandable material being vaporized or decomposed into gas by heating at or above a predetermined temperature so as to expand said shell outward.

3. A sheet according to claim 1, wherein an average thickness of said release agent layer is 0.1 to 20 μm.

4. A sheet according to claim 1, wherein said external stimulus is an activation energy beam.

5. An adhesive sheet for use with electronic materials, comprising:
    an adhesive base sheet, an adhesive layer, and a release sheet provided in this order from said adhesive base sheet, wherein
    said release sheet comprises a release base material, a primer layer, and a release agent layer provided in this order and the release agent layer faces the adhesive layer of the adhesive sheet;
    in response to an external stimulus, a release force between said release sheet and said adhesive layer is decreased;
    the primer layer and the release agent layer of the release sheet form a multilayer and the primer layer comprises an expandable fine particle that expands in response to the external stimulus;
    both said adhesive layer and said release agent layer comprise a non-silicone compound; and the release agent layer, the primer layer, and the release base material are structured and arranged to be released together from the adhesive layer when the release sheet is peeled after receiving the external stimulus.

6. The adhesive sheet according to claim 1, wherein the release agent comprises a non-silicone release agent.

7. The adhesive sheet according to claim 6, wherein the non-silicone release agent is chosen from a rubber resin, a long chain alkyl resin, and an alkyd resin.

8. The adhesive sheet of claim 7, wherein the non-silicone release agent comprises a rubber resin chosen from 1,4-polybutadiene, 1,2-polybutadiene, and mixtures thereof.

9. The adhesive sheet of claim 8, wherein the rubber resin comprises all cis-1,4-polybutadiene, all trans-1,4-polybutadiene, or a combination of cis- and trans-1,4-polybutadiene.

10. The adhesive sheet of claim 7, wherein the non-silicone release agent is a polymer of alkylacrylate.

11. The adhesive sheet of claim 10, wherein the polymer of alkylacrylate comprises a polymer or a copolymer of alkylacrylate with 8 carbon atoms or more.

12. The adhesive sheet of claim 11, wherein the polymer of alkylacrylate comprises a polymer or a copolymer of alkylacrylate with 10 carbon atoms or more.

13. The adhesive sheet of claim 12, wherein the polymer of alkylacrylate comprises a copolymer of stearylacrylate and 2-(perfluorooctyl)ethylacrylate.

14. The adhesive sheet of claim 10, wherein the alkylacrylate comprises an alkylacrylate in which a fluorine atom has been substituted for a hydrogen atom in the alkylacrylate.

15. The adhesive sheet of claim 1, wherein the adhesive layer comprises a non-silicone adhesive agent.

16. The adhesive sheet of claim 15, wherein the non-silicone adhesive agent comprises rubber, acryl, polyester, or urethane.

* * * * *